United States Patent
Suzuki

(10) Patent No.: US 6,569,716 B1
(45) Date of Patent: *May 27, 2003

(54) METHOD OF MANUFACTURING A POLYCRYSTALLINE SILICON FILM AND THIN FILM TRANSISTOR USING LAMP AND LASER ANNEAL

(75) Inventor: Koji Suzuki, Aichi (JP)

(73) Assignees: Sanyo Electric Co., Ltd., Osaka (JP); Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/026,968

(22) Filed: Feb. 20, 1998

(30) Foreign Application Priority Data

Feb. 24, 1997 (JP) ............................... 9-039226

(51) Int. Cl.⁷ ........................ H01L 21/00; H01L 21/84
(52) U.S. Cl. .................. 438/149; 438/166; 438/308; 438/487
(58) Field of Search ................. 438/486, 487, 438/488–491, 795, 510, 530, 532, 417, 430, 657, 684, 764, 149, FOR 478, 160, 166, 308

(56) References Cited

U.S. PATENT DOCUMENTS

| | | | | |
|---|---|---|---|---|
| 5,219,786 A | * | 6/1993 | Noguchi | 438/5 |
| 5,624,851 A | * | 4/1997 | Takayama et al. | 438/166 |
| 5,714,392 A | * | 2/1998 | Dawson et al. | 437/8 |
| 5,817,548 A | * | 10/1998 | Noguchi et al. | 438/160 |
| 5,904,770 A | * | 5/1999 | Ohtani et al. | 438/485 |

* cited by examiner

Primary Examiner—Wael Fahmy
Assistant Examiner—Hoai Pham
(74) Attorney, Agent, or Firm—Hogan & Hartson, LLP

(57) ABSTRACT

An a-Si film (20) is formed so as to straddle a gate electrode (12) formed of high thermal conductive materials on a substrate (10) via a gate insulating film (14). The a-Si is subjected to an RTA process with the irradiation of a halogen lamp and a laser annealing process with the irradiation of an excimer laser to obtain a p-Si film (24) by polycrystallizing the a-Si film (20). By performing two types of annealing, uniform polycrystalline of grains with an appropriate size may be obtained, even over a region of the gate electrode (12) in the a-Si film (20). When the obtained p-Si film (24) is used as an active layer of TFT (a channel region), a polycrystalline silicon TFT with a bottom gate structure having excellent characteristics may be obtained.

22 Claims, 6 Drawing Sheets

EXCIMER LASER

RTA + ELA

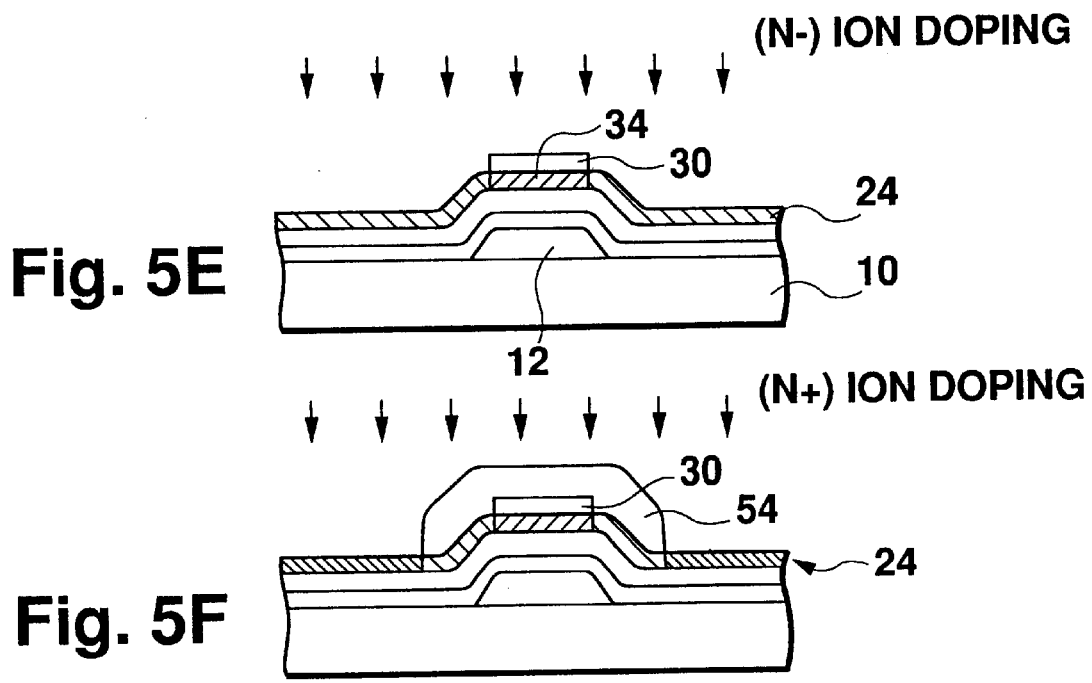
Fig. 5E
Fig. 5F
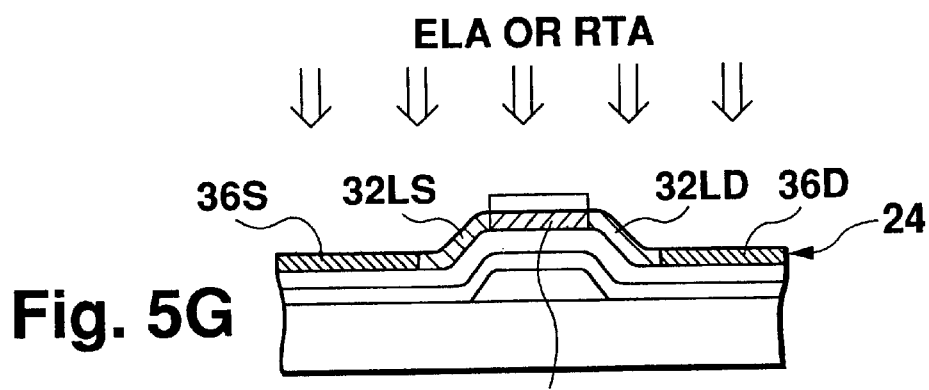
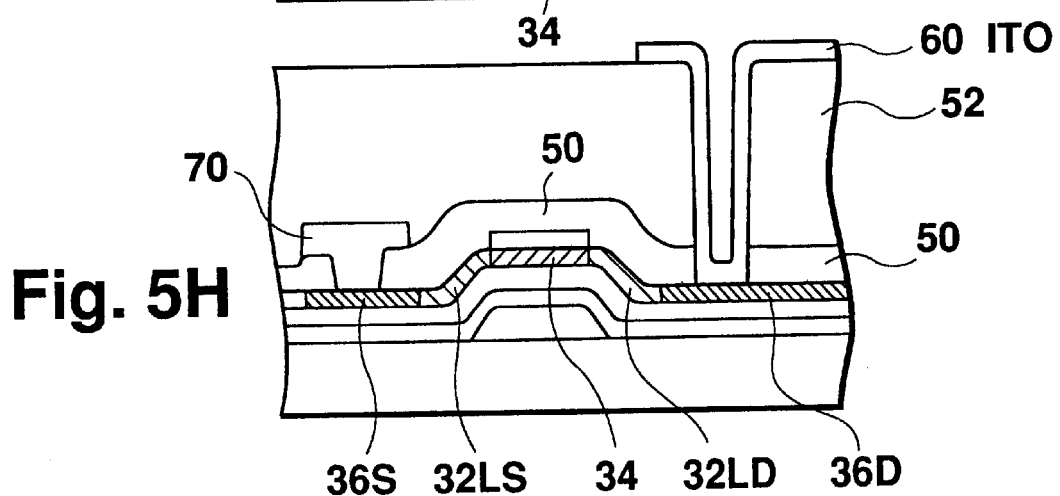
Fig. 5G
Fig. 5H

METHOD OF MANUFACTURING A POLYCRYSTALLINE SILICON FILM AND THIN FILM TRANSISTOR USING LAMP AND LASER ANNEAL

BACKGROUND OF THE INVENTION

1. Field of the Invention

The present invention relates to various kinds of transistors such as a Thin Film Transistor (TFT) in a matrix type display apparatus such as a liquid crystal display. More particularly, the invention relates to a method of manufacturing a polycrystalline silicon layer which for use as the active layer of a transistor.

2. Description of the Related Art

There is increasing demand for display devices to display images with high resolution and high quality. To fulfill this requirement, Active Matrix Liquid Crystal Displays (AMLCD) using a thin film transistor as switching element for driving the crystal liquid are commonly used in liquid crystal displays.

Such AMLCDs with a TFT, commonly comprise an amorphous silicon TFT using an amorphous silicon region and a polycrystalline silicon TFT using a polycrystalline silicon film as an active layer of a thin film transistor as a channel region.

Among TFTs, the amorphous silicon TFT can be easily formed on a glass substrate at a low cost with a lower melting point because it may be formed at a lower temperature (e.g. 300° C.). Additionally, the amorphous silicon TFT is advantageous to increasing the size of a display panel because it is easy to form a uniform amorphous silicon film over a large area. Therefore, the amorphous silicon TFTs are currently used for large LCDs.

However, because the mobility degree in the polycrystalline silicon film is higher than that in the amorphous silicon film, an "on" current flows more in the polycrystalline silicon TFT and a sheet resistance ("on" resistance) of the polycrystalline silicon TFT is lower. These characteristics allow the polycrystalline silicon TFT to show improved response characteristics and a better ability to drive a display. Accordingly, it is now understood that the polycrystalline silicon TFT is useful as switching elements in a high resolution, quality LCD. In addition, it is pointed out that the polycrystalline silicon TFT is useful as switching element to drive a liquid crystal for a larger LCD because a selection period (duty ratio) becomes shorter as the display becomes larger. Furthermore, since the polycrystalline silicon TFT uses the polycrystalline silicon film as an active layer, it can be used not only as a driving element for liquid crystals in a pixel portion, but also as a switching element constituting a logic circuit for a driver circuit. Furthermore, it is possible to form the driver elements for liquid crystals and the elements for a logic circuit on a same substrate in a same process. Accordingly, the polycrystalline silicon TFT is currently used for many small or middle sized LCDs which are required to have high resolution and high quality and to be small-sized, as a so-called a driver containing LCD in which a pixel portion and a driver portion are formed on a same substrate.

As mentioned above, a polycrystalline silicon TFT remains advantageous to use in larger displays because such a TFT enables a high resolution and quality LCD to be formed with space around the edges of the panel where the driver could contain. Such a panel would be lightweight.

To achieve these goals, it is necessary to form a polycrystalline silicon TFT on a cheap glass substrate having a low melting point (about 600° C.) with a high yield rate comparable to that of an amorphous silicon TFT. Currently, however, it is difficult to form a polycrystalline silicon film having grains with an appropriate size at a temperature below a melting point of the glass substrate (about 600° C.). Therefore, it is suggested that an amorphous silicon film first be formed on a substrate and then a polycrystalline silicon film be formed by polycrystallizing the amorphous silicon film at a comparative low temperature using a laser annealing.

For example, in a preparation of a polycrystalline silicon TFT with a bottom gate structure for LCD as shown in FIG. 1A–1D, it is known a laser annealing method in which an amorphous silicon film formed on a glass substrate is heated by irradiating an excimer laser to polycrystallize the amorphous silicon film.

In the preparation of the polycrystalline silicon TFT with a bottom gate structure, a Cr film is first formed on a glass substrate 10. After a certain pattern is formed on the film, a gate electrode 12 integral with a gate wiring is made. Next, as shown FIG. 1B, a gate insulating film 14 having a two layered structure and an amorphous silicon film 20 (which will be referred to as an a-Si film hereinafter) are successively formed with a plasma CVD (Plasma Enhanced Chemical Vapor Deposition).

Then, the a-Si film 20 is subjected to anneal by irradiating an excimer laser (ELA: Excimer Laser Annealing) to polycrystallize the formed a-Si film 20 and obtain a polycrystalline silicon 22 (which will be referred to as a p-Si hereinafter). The substrate temperature in this instance is normally a temperature ranging from a room temperature to about 300° C.

After the p-Si film 22 is obtained through polycrystallization, a channel stopper film 30 consisting of $SiO_2$ is formed at a region where a channel region 44 is to be formed (the region corresponding to the gate electrode 12) on the p-Si film 22 (See FIG. 1D). Next, an impurity (e.g. phosphorus) is doped to a region corresponding to a source drain region of a TFT by using a channel stopper 30 as a mask from above, as shown in the drawing. It should be noted that the TFT in FIG. 1D includes an LDD (Lightly Doped Drain) structure, that regions 42LS and 42LD are lightly doped source drain regions (N-), and that regions 40S and 40D are heavily doped regions (N+) in the drawing.

After doping, these doped impurities are activated by a Rapid Thermal Annealing (RTA) with lamp annealing, thereby forming source and drain regions and a channel region in the p-Si film 22. After that, interlayer insulating films 50 and 52 are formed while a source electrode (which also acts as a source wiring in many cases) 70 is connected to the source region 40S. In case of a TFT for pixel portions in an LCD, a transparent conductive film of ITO (Indium Tin Oxide) which acts as a pixel electrode 60 is connected to the drain region 40D, thereby the other side of substrates for an LCD is obtained. A plan view of the TFT shown in FIG. 1D will be an arrangement as shown in FIG. 2. (It should be noted that FIG. 2 shows a status before the source electrode 70 and the pixel electrode 60 are formed.)

As outlined above, in a conventional polycrystalline silicon TFT with a bottom gate structure, the p-Si film 22 is obtained by polycrystallizing the a-Si film 20 with the ELA.

Since the polycrystallization of such an a-Si depends on the supplied amount of heat, i.e. the amount of energy, it is important to control the amount of heat so that it is uniformly supplied to an a-Si film. Namely, the energy of the excimer laser per unit area should be uniformly applied to the a-Si film in order to form a uniform p-Si film 22.

However, there is a drawback that the size of grains in the p-Si film 22 formed by the ELA are not uniform over all of the area.

The most critical reason why such non-uniformity occurs in the TFT with the bottom gate structure is that the a-Si film 20 to be polycrystallized is formed so as to cover the upper portion of the gate electrode 12 having a high thermal conductivity. Namely, the a-Si is formed to stride across the gate electrode 12 as shown in FIGS. 1A–1D or FIG. 2. The thermal conductivity of a metallic material (for example Cr) constituting the gate electrode 12 is higher than that of the other areas of the glass substrate 10 around the gate electrode 12. When the excimer laser is applied to the a-Si film 20, the heat provided by the excimer laser diffuses faster in a region of the a-Si film 20 under which the gate electrode 12 lies than in the other regions of the a-Si film 20 under which the glass substrate lies because of the existence of the gate electrode 12 and gate wiring.

For example, as shown in FIG. 3, the a-Si film 20 is formed with appropriate grain size polycrystalline silicon in an area 22Sub where the gate electrode 12 does not exist. By contrast, the a-Si film 20 is insufficiently polycrystallized in a region where the gate electrode 12 exists, thereby a polycrystalline silicon with an appropriate grain size can not be formed, even under the same annealing condition.

It may be considered that the condition for the laser annealing may be controlled so that grains of polycrystal in a region 22G sufficiently grow, because the region 22G, under which the gate electrode lies, in the p-Si film 22 formed by the polycrystallization constitutes a channel region of the TFT. However, if the condition for the annealing is set so that the grains in the region 22G of the silicon film under which the gate electrode 12 lies have an appropriate size, the size of polycrystalline grains in the region 22Sub must exceed an appropriate range, otherwise, the grains will become too small due to the oversupply of energy. This makes the characteristics of the region out of an allowable range. Accordingly, even if the annealing conditions are adjusted for the polycrystallization in the channel region, p-Si film with grains of an appropriate size can not be formed.

Furthermore, when the TFT is constituted of the p-Si film 22 with non-uniform grain sizes over a plane, as mentioned above, the characteristics of the respective TFT (e.g. an "on" current and a sheet resistance depending on the grain size) varies widely. This causes a non-uniformity of the display and badly affects the quality of the display with the LCD when it is employed as a TFT for pixel portions in an LCD.

SUMMARY OF THE INVENTION

The present invention is made to resolve the above mentioned problems and it is an object of the present invention to form a uniform polycrystalline silicon by polycrystallizing an amorphous silicon. Furthermore, it is another object of the present invention to provide a thin film transistor with excellent characteristics by using polycrystalline silicon films of the invention.

The present invention is made to attain the above objects and characterized by the following.

A method of manufacturing a polycrystalline silicon film according to the present invention comprises steps of forming an amorphous silicon film so that it covers at least a portion of a material film which has a high thermal conductivity and is formed on a substrate, and polycrystallizing the amorphous silicon film by subjecting the amorphous silicon film to a lamp annealing process and a laser annealing process after the amorphous silicon film is formed to obtain a polycrystalline silicon film.

An amorphous silicon region under which the material film with a high thermal conductivity lies can be sufficiently heated by lamp annealing, thereby forming a polycrystalline silicon having an appropriate grain size on the material film over which it would be difficult to fully polycrystallize only the region using laser annealing. The constitution in which an amorphous film is formed above the high thermal conductivity material film may be applied to a TFT with a bottom gate structure, a semiconductor device with a multi-layer structure, or the like. By forming a polycrystalline silicon film from an amorphous silicon film according to the present method, it is possible to increase advantages of such TFTs or the semiconductor devices with a multi-layer structure.

Another aspect of the present invention relates to a method of manufacturing a thin film transistor with a bottom gate structure formed on a glass substrate and comprising the steps of forming an amorphous silicon film over a gate electrode film having a gate insulating film therebetween, and polycrystallizing the amorphous silicon film by subjecting the amorphous silicon film to a lamp annealing process and a laser annealing process after the amorphous silicon film is formed so as to form a polycrystalline silicon as an active layer of the thin film transistor.

Further, in a method of manufacturing a thin film transistor with a bottom gate structure formed on a glass substrate, the present invention may comprise the steps of polycrystallizing an amorphous silicon film by subjecting the amorphous silicon film to a lamp annealing process and a laser annealing process after the amorphous silicon film is formed as described above so as to form a polycrystalline silicon film, doping impurities to the polycrystalline silicon film, and activating the doped impurities by subjecting the polycrystalline silicon film to the laser annealing process and/or the lamp annealing process so as to form source and drain regions and a channel region of the thin film transistor in the polycrystalline silicon film.

When the polycrystalline silicon TFT with the bottom gate structure is manufactured, polycrystallines with an appropriate grain size can be obtained by subjecting the amorphous silicon in the active layer (a channel region) of the TFT formed over the gate electrode with the high thermal conductivity to the lamp annealing process and the laser annealing process. A polycrystalline silicon TFT with excellent characteristics can thus be obtained. In addition, since the polycrystallization under a low temperature becomes possible, the polycrystalline silicon film can be formed on a cheap glass substrate. The polycrystalline silicon TFT may be easily prepared with such films.

In addition, the present invention comprises the steps of subjecting an amorphous silicon film to a rapid thermal annealing process by applying a heat lamp and subjecting the amorphous silicon film to a laser annealing process by irradiating an excimer laser before or after (specially just after) the rapid thermal annealing process so as to polycrystallize the amorphous silicon film and to form the polycrystalline silicon film.

A polycrystalline silicon TFT formed by the above mentioned method can be easily used as a switching element for driving pixels of a matrix type display apparatus such as liquid crystal display apparatus and/or as a switching element for a driver circuit of a display apparatus. Especially, since a polycrystalline silicon TFT is obtained in accordance with the present invention, it becomes possible to form both switching elements for driving pixels and switching elements for a driver circuit of a display apparatus on one substrate in a same process, thereby reducing the cost of a display apparatus. In addition, since a driver circuit may be contained in the periphery of the panel, it is possible for the display apparatus to be made thinner and lighter. Also, the display quality of the display apparatus can be improved. These are advantageous factors as display size is increased.

In accordance with the present invention, an annealing apparatus for polycrystallizing an amorphous silicon film may comprise rapid thermal annealing processing portion for annealing an object to be annealed by applying halogen light and laser annealing processing portion for annealing the object to be annealed by applying an excimer laser.

When the annealing apparatus in which the rapid thermal annealing processing portion and the laser annealing processing portion are closely provided is employed, it is possible to form a polycrystalline silicon having uniform grains with an appropriate size from amorphous silicon at a low temperature. Also, since it is then possible to configure a simple annealing apparatus, labor can be significantly reduced.

BRIEF DESCRIPTION OF THE DRAWINGS

FIGS. 5A, 5B, 5C, 5D, 5E, 5F, 5G, and 5H show a process for manufacturing a polycrystalline silicon TFT with a bottom gate structure in accordance with an embodiment of the present invention;

DESCRIPTION OF THE PREFERRED EMBODIMENT

Preferred embodiments of the present invention will be described in reference with the drawings as follows. It should be noted that corresponding portions will be indicated using the same numeral and their description will not be repeated.

[A method of Polycrystallizing a-Si]

The embodiment employs two kinds of annealing processes, an RTA using a lamp and an ELA using an excimer laser as annealing process to polycrystallize a-Si. Especially, the above two kinds of annealing processes are employed to appropriately polycrystallize an active region of a TFT, i.e. a channel region portion in the TFT with a bottom gate structure in which a gate electrode lies under a portion of an amorphous silicon film to be polycrystallized.

Figure 1A:
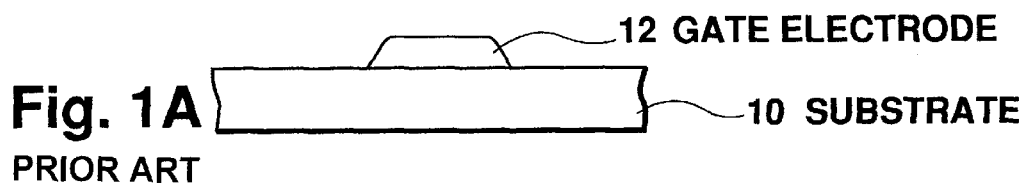
FIGS. 1A, 1B, 1C, and 1D show a process for manufacturing a polycrystalline silicon TFT with a bottom gate structure in a relevant art.
Figure 1B:
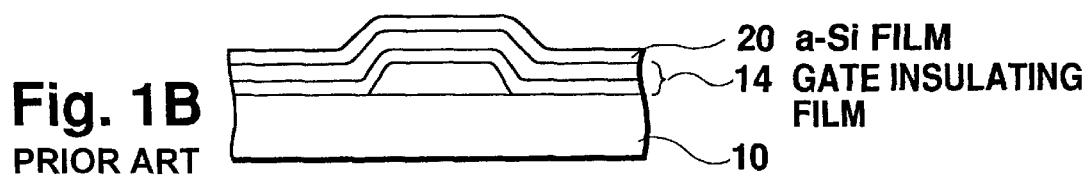
Figure 1C:
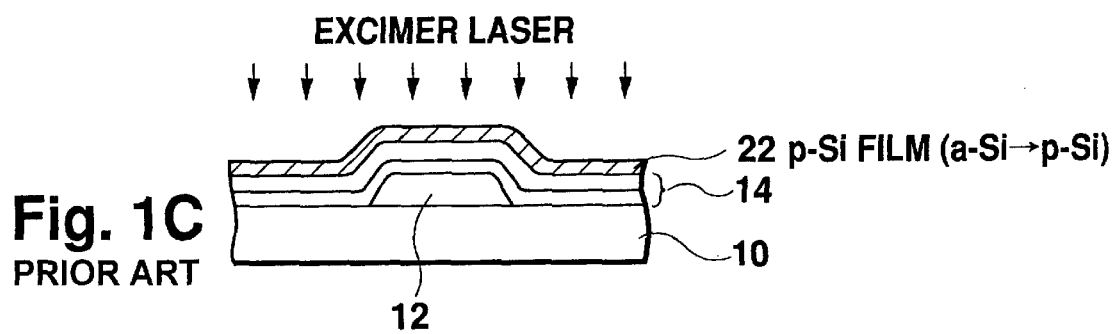
Figure 1D:
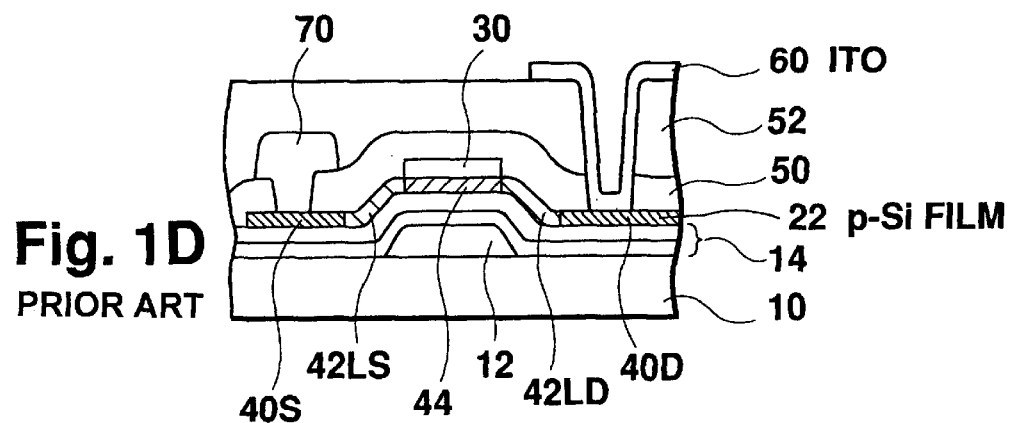
Figure 2:
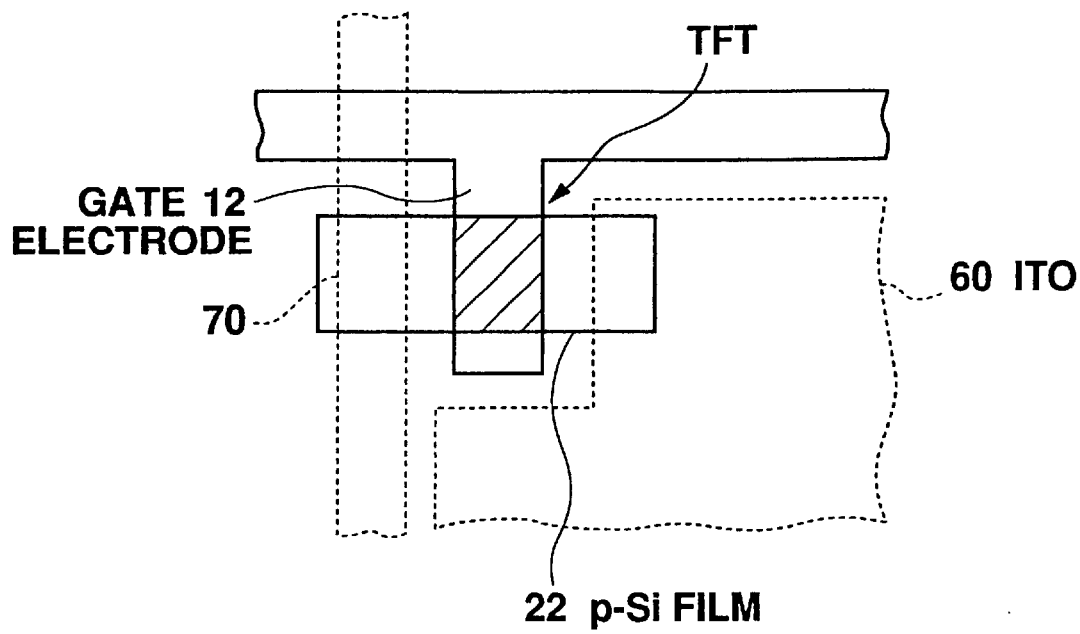
FIG. 2 shows a plan view of a TFT with a bottom gate structure for driving liquid crystals in a relevant art.
Figure 3:
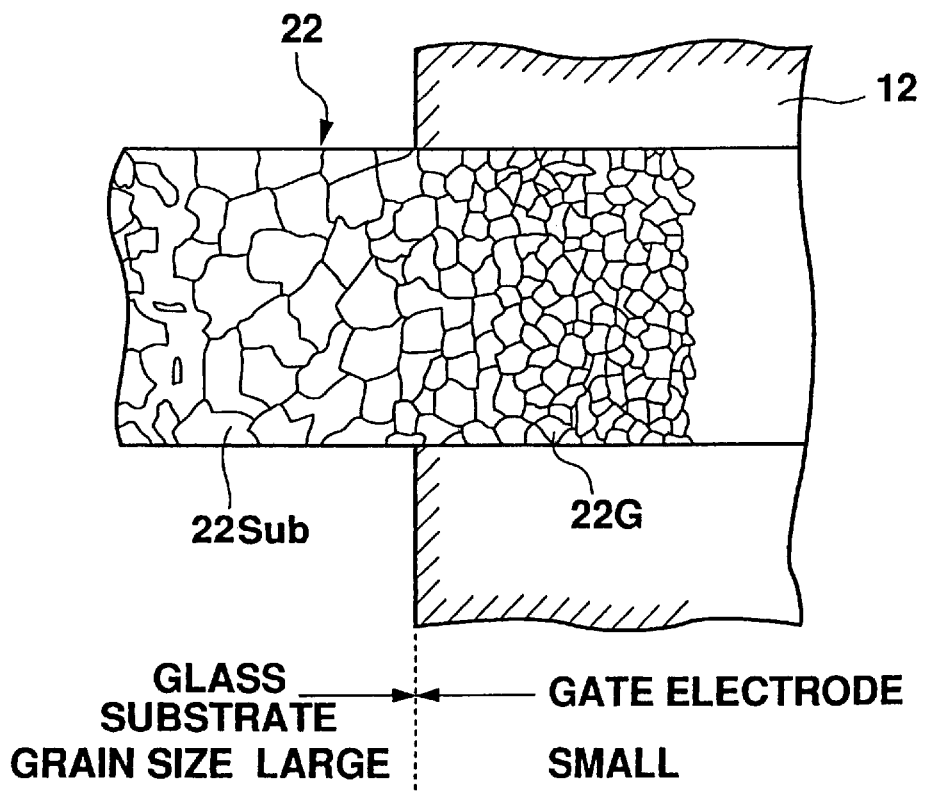
FIG. 3 shows a state in which a p-Si film is polycrystallized by a polycrystallization method according to a relevant technology.
Figure 4:
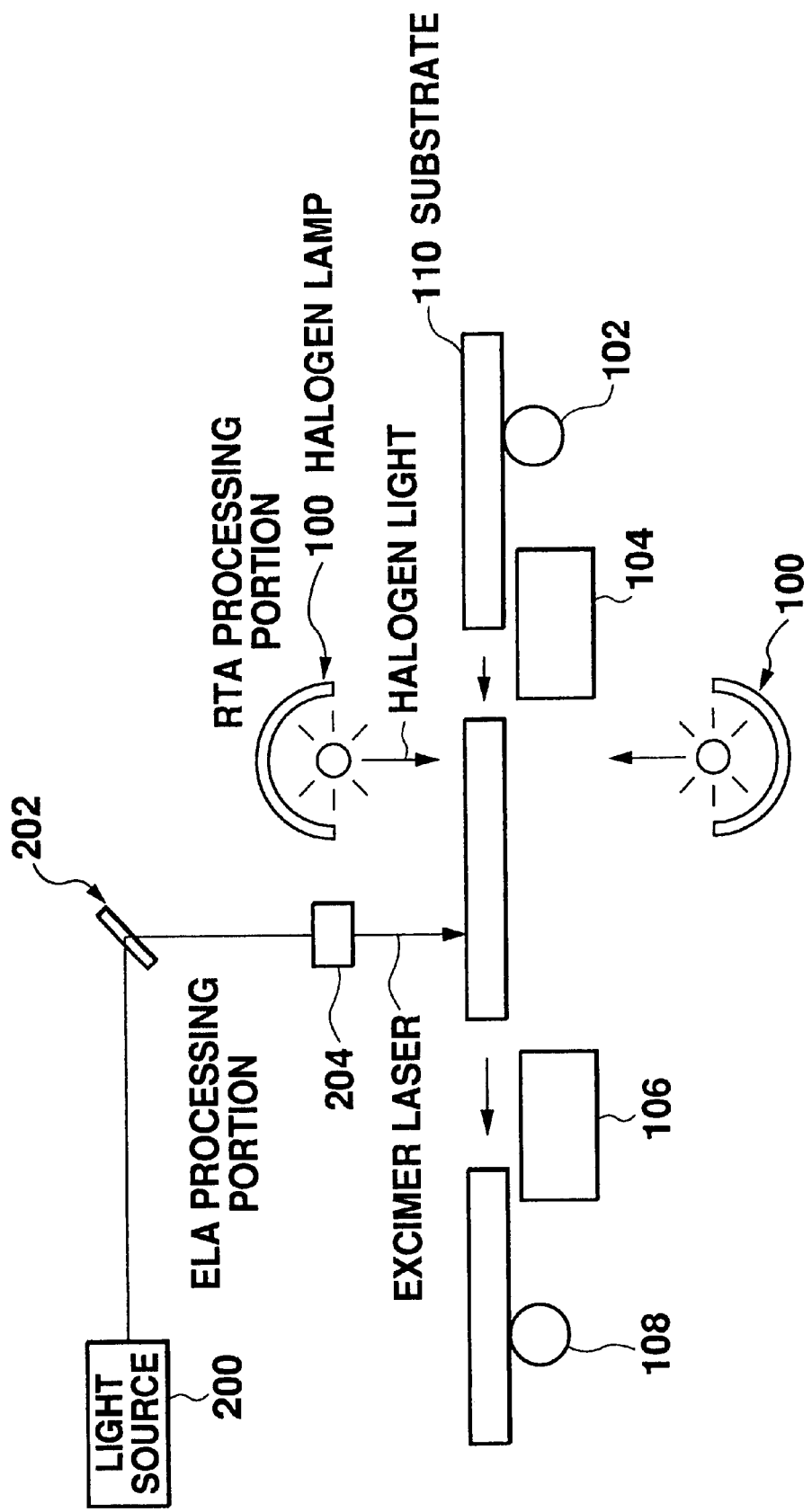
FIG. 4 shows a configuration of an annealing apparatus to polycrystallize an a-Si in accordance with an embodiment of the present invention.

An annealing apparatus according to the embodiment of the present invention is constituted as shown in FIG. 4.

A configuration of an RTA processing portion will first be described. The RTA processing portion is just like an RTA apparatus. In the embodiment, a carrying roller 102 carries a substrate 110 on which an a-Si film has been formed as an object to be annealed to a pre-heat section 104 in the apparatus. The pre-heat section 104 first heats the carried substrate 110. Halogen lamps (e.g. xenon arc lamps) 100 are provided above and below a path through which substrates 110 are carried. While the preheated substrate 110 passes through a line shaped heating field with these halogen lamps 100, the a-Si is heated and then a polycrystallization occurs.

After passing the heating field, the substrate 110 is carried to a cooling section 106. In the cooling section 106, the temperature is maintained at a predetermined level to control the decrease rate of the temperature in the substrate 110 so that an excessive cool down in the substrate 110 may be avoided after the substrate 110 passes the heating field. After passing the cooling section 106, the substrate 110 is carried out of the apparatus by a carrying roller 108 and then proceeds to next process (e.g., channel stopper forming process in the present embodiment).

An excimer laser-emitting portion 204 in the ELA processing means is provided in a stage just after the heating field with the halogen lamps 100 in the RTA processing means. The a-Si film heated by the irradiation of halogen light is further subject to the irradiation of excimer laser. The excimer laser-emitting portion 204 is configured so as to emit a line of laser radiation. The line-shaped excimer laser beam is irradiated to the a-Si on a surface of the substrate 110. The ELA processing portion comprise a light source 200, an optical system 202, and the excimer laser-emitting portion 204. The excimer laser is supplied from the light source 200 to the excimer laser-emitting portion 204 through the optical system 202. It should be noted that the ELA processing means and the RTA processing means are not necessarily provided as shown in FIG. 4, and another configuration in which the excimer laser emitting portion 204 of the ELA processing portion is provided in a stage prior to the halogen lamp 100 of the RTA processing portion may be employed.

The excimer laser is successively irradiated to the a-Si film after the irradiation of the halogen light by means of the annealing apparatus configured as shown in FIG. 4. With this arrangement, two kinds of annealing may be performed against the a-Si so that the p-Si having grains with an appropriate size is formed over a region of a gate electrode while an a-Si can be appropriately polycrystallized into a p-Si over a region of the glass substrate.

The reason why such advantage is obtained by employing two kinds of annealings will be described as below.

As described in the conventional technology, by using ELA, the polycrystallization in the a-Si region under which the glass substrate lies proceeds prior to the polycrystallization in the a-Si region under which the gate electrode lies.

By contrast, when an a-Si is polycrystallized using RTA with halogen lamps, halogen light is little absorbed by the a-Si film, but is greatly absorbed to the gate electrode. If the RTA is applied to the a-Si film striding across the gate electrode, the polycrystallization in the a-Si film under which the gate electrode lies proceeds faster than the other portion of the a-Si film, because the gate electrode generates heat when it absorbs halogen light. On the other hand, since halogen light is not absorbed to the glass substrate to the degree it is by the a-Si film, the amount of heat absorbed to a region of the a-Si film over the glass substrate is less than that absorbed to a region of the a-Si film over the gate electrode, thereby the polycrystallization in the region of the a-Si film over the glass substrate is relatively slow.

As shown in FIG. 4, RTA and ELA may be combined for polycrystallization. The excimer laser may be irradiated to an a-Si while a region of the a-Si over the gate electrode is heated more than other regions of the a-Si by irradiation with halogen light. Accordingly, it is possible to sufficiently heat the region of the a-Si in which the heat provided by the irradiation of the excimer laser would be insufficient due to the thermal diffusion in the gate electrode. Thus, after the irradiation of the excimer laser, the difference in temperature between the a-Si film over the gate electrode and that over the glass substrate becomes small. This promotes uniform polycrystallization and makes it possible to obtain a p-Si film having grains of an appropriate size. Furthermore, it is possible to make the most important channel region of a TFT, i.e. an a-Si over the gate electrode, having grains of a sufficient size without degrading the quality of the p-Si film in the source and drain regions.

From the point of view that manufacture of polycrystalline silicon TFT on a cheap glass substrate with low melting point is desirable, it is advantageous to combine the RTA and ELA annealing processes. When ELA is employed, it is possible to perform the process at a substrate temperature of 300° C. in this instance, though it is difficult to sufficiently polycrystallize a region of the a-Si over the gate electrode as mentioned above. On the other hand, it is necessary to heat the film shown in FIG. 4 to a temperature ranging about from 600° C. to 900° C. in order to sufficiently polycrystallize the a-Si using only RTA. However, in the case of the substrate temperature of 600°0 C. or above, it becomes difficult to use cheap glasses, which generally have a melting point of about 600° C., as a substrate.

According to this embodiment, since the excimer laser is irradiated on the a-Si, it is not necessary to set a high temperature for RTA. For example, a temperature of 500° C. or less may be used. Accordingly, the present invention makes it easy to form a polycrystalline silicon TFT with a good quality film, even on a glass substrate having a low heat resistance.

[A Method of Manufacturing a Polycrystalline Silicon TFT]

Next will be described an example of a manufacturing method for a polycrystalline silicon TFT with a bottom gate structure using the above-mentioned polycrystallization process for a-Si in reference with FIG. 4, FIG. 5A–5H, and FIG. 6.

Figure 5A:
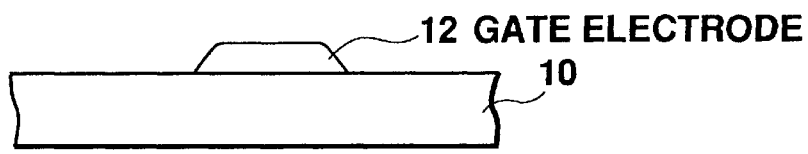
Figure 5B:
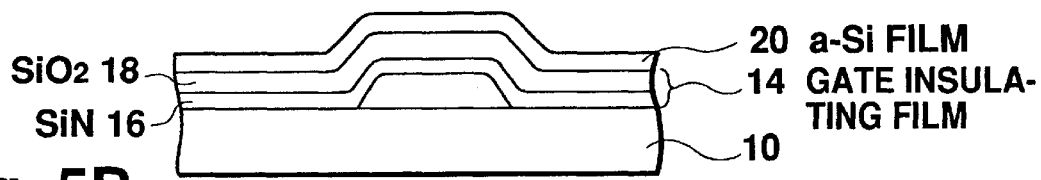

As shown in FIG. 5A, Cr (W, Ta, or TaMo may be substituted) is first formed on an insulating substrate 10 such as a glass and so on by sputtering in order to make both of a gate electrode and a gate wiring which is integral with the gate electrode (simply referred to as a gate electrode 12 hereinafter). A desired pattern is then made on it as shown FIG. 6.

After the gate electrode 12 is formed on a surface, a gate insulating film 14 with a two-layered structure (SiN 16, SiO$_2$ 18) and an a-Si film 20 are successively formed over the entire substrate 10 including the surface by a PE-CVD. (See FIG. 5B)

Figure 5C:
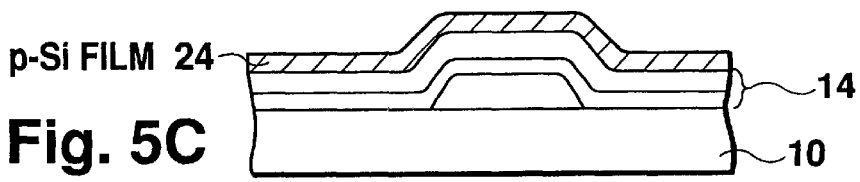

Next, by using the annealing process apparatus of FIG. 4, RTA and ELA are applied to the a-Si film 20, thereby a p-Si film 24 is formed as a result of polycrystallization of the a-Si film 20 as shown in FIG. 5C. By employing both RTA and ELA, a uniform p-Si region having an appropriate grain size is formed, especially in a region where the a-Si film 20 lies over the gate electrode 12, which is the region which becomes a channel region in a TFT of silicon films.

Figure 5D:
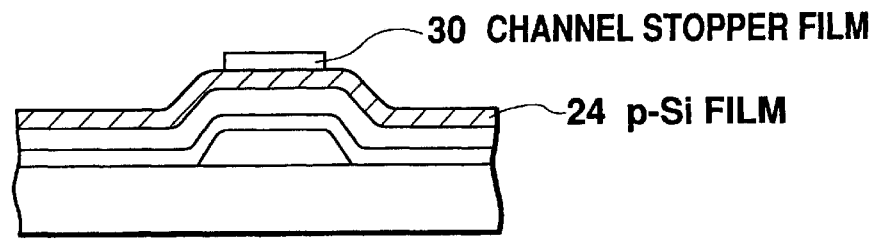

After the a-Si is polycrystallized, a channel stopper film 30 of SiO$_2$ is formed on the p-Si film 24 at a position corresponding to a location of the gate electrode 12 by an exposure from the back of the substrate 10 (so-called a backside exposure) as shown in FIG. 5D.

After the channel stopper film 30 is formed, a region where impurities (N−) are lightly doped is formed in an area other than a region just below the channel stopper film 30 (a channel region 34) by doping impurities (P) into the p-Si film 24 through the channel stopper film 30 as a mask as shown in FIG. 5E.

Then, as shown in FIG. 5F, an area to be the channel region and LD region is covered by a mask 54 to form the LD (Lightly Doped) region of a TFT with an LDD structure. The same conductive impurities used for light doping are heavily doped into the p-Si film 24. A heavily doped region (N+) is thereby formed outside the LD region covered by the mask 54.

After the impurities are lightly and heavily doped, an activating annealing process is applied to activate the doped impurities as shown in FIG. 5G. LD source and drain regions 32LS and 32LD and source and drain regions 36S and 36D of a TFT are respectively formed by this annealing process.

Either one of ELA or RTA may be used for the impurity activating annealing process. ELA and RTA may also be combined as in the case of polycrystallization. The annealing temperature for the activating annealing will be determined so that a film temperature in the p-Si film 24 is about 900° C. in case of ELA (The substrate temperature is a temperature ranging from a room temperature (about 20° C.–25° C.) to about 300° C.) and so that the substrate temperature (the temperature of the heated field) is about 600° C.

Figure 6:
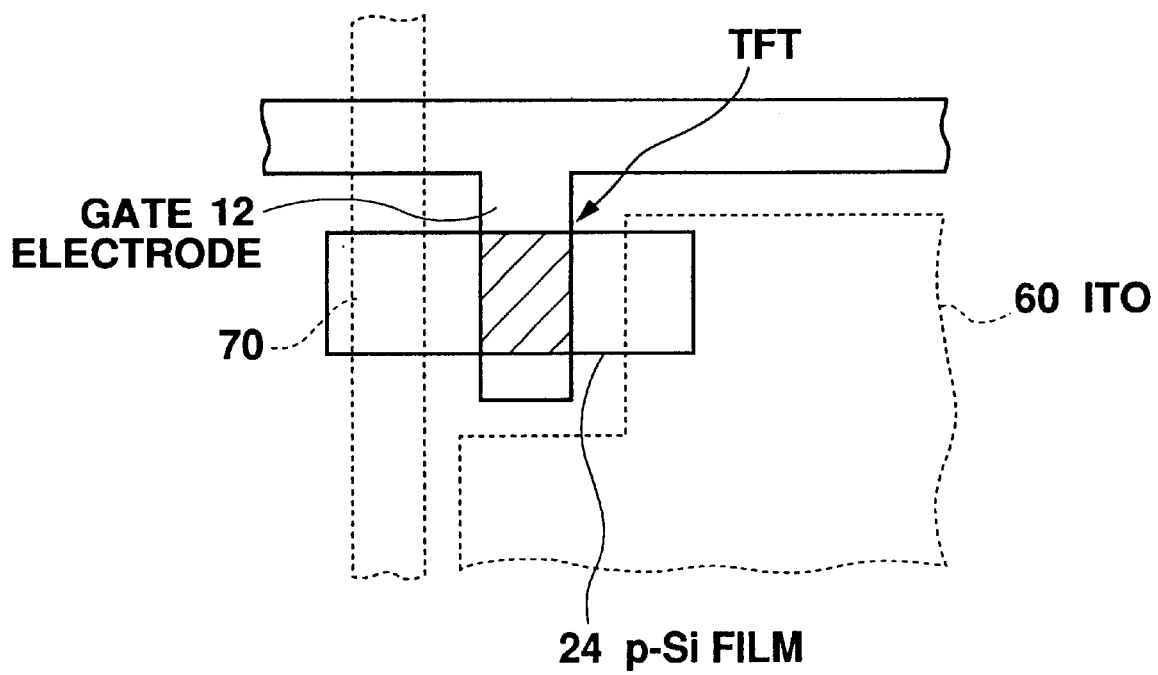
FIG. 6 shows a plan view of a liquid crystal driver TFT employing the polycrystalline silicon TFT in accordance with an embodiment of the present invention.

After the impurities are activated, a desired pattern is made on the p-Si film 24 as shown in FIG. 6. Then, as shown in FIG. 5H, an interlayer insulating film 50 is formed with a laminated layer of SiO$_2$ and SiN. A contact hole is opened at a position of the source region 36S in the interlayer insulating film 50. Then, a source electrode 70 of Al is formed through the hole and connects with the source region 36S.

Figure 7:
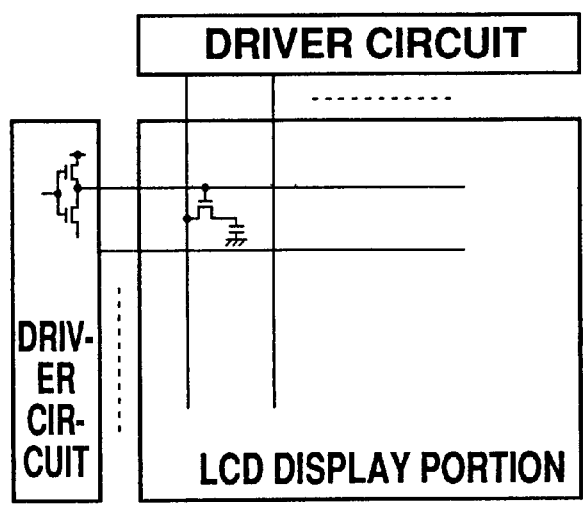
FIG. 7 schematically shows an example in which the polycrystalline silicon TFT in accordance with an embodiment of the invention is used as a TFT for pixels of the liquid crystal display apparatus and a TFT for a driver circuit.

When a liquid crystal driver TFT for a liquid crystal display apparatus as shown in FIG. 7 is made, a planarized film 52 is further formed with an upper layer of acrylic resin and a contact hole is opened through the planarized film 52 and the interlayer insulating film 50. ITO, which will be a pixel electrode 60, is formed through the hole and connects with the drain region 36D. Although the source region 36S is connected to the source electrode 70 and the drain region 36D is connected to the pixel electrode 60 in FIG. 5H, the source region 36S may also be connected to the pixel electrode 60.

As described above, a TFT as shown in FIG. 5H is formed for the respective pixel in a matrix of image display portion in an LCD panel and one side (i.e. TFT substrate) of two substrates constructed an LCD is obtained. This substrate and the other substrate in which common electrodes and color filters are formed are then laminated, and an LCD apparatus is obtained by sealing liquid crystal therebetween. By controlling a voltage of the pixel electrode 60 with the respective TFT, a desired voltage is applied between the common electrode and the liquid crystal, thereby a display is performed.

It should be noted that the pixel electrode 60 may be saved in a case that the TFT made by the above processes is used as various kinds of memory element or a logic circuit element in an IC or a logic circuit element for a driver circuit of a liquid display apparatus instead of as elements for driving a liquid crystal. In the case, a drain electrode 70 is formed and connects with the drain region 36D in a similar way at time that the source electrode 70 is formed. After the source and drain electrodes are formed, they are connected to the corresponding source and drain wiring, respectively. Note that a necessary wiring pattern may be formed at the same time when the source and drain electrodes are formed in a case that the electrodes and the wiring are integrally formed.

The p-Si TFT of the embodiment is able to be used as a TFT for pixel driving switch and a TFT for driver circuit of an LCD as shown in FIG. 7. Furthermore, in a case where for example, a CMOS (Complementary Metal Oxide Semiconductor) is to be formed as an element for a driver circuit of an LCD as shown in FIG. 7, an n-channel (n-ch) TFT and a p-channel (p-ch) TFT are formed using p-Si TFTs of the embodiment. Specifically, in the processes shown in FIGS. 5E and 5F, a region for the formation of p-ch TFT is covered by a masking material when n type impurities are doped in advance. Then, after n type impurities are doped, the masking materials covering p-ch TFT is stripped off and then the n-ch TFT region is masked conversely. In this state, p type impurities are doped in a similar way as of FIG. 5E. (It should be noted that an LDD structure is not employed.) After n type and p type impurities are doped, the activating processes are simultaneously performed on the n-ch TFT and p-ch TFT, thereby forming a TFT as shown in FIG. 5G. (Note that the process for forming a pixel electrode 60 is not needed for a TFT for a driver circuit.)

What is claimed is:

1. A method of manufacturing a polycrystalline silicon film, comprising the steps of:

forming an amorphous silicon film over a material film formed on a substrate, the material film having a higher thermal conductivity than the substrate surrounding said material film; and polycrystallizing the amorphous silicon film by subjecting the amorphous silicon film to a lamp annealing process using lamp irradiation applied at least from the above substrate and a subsequent laser annealing process using a laser beam applied from above the substrate after the lamp annealing process.

2. The method of manufacturing a polycrystalline silicon film according to claim 1, wherein the step of polycrystallizing the amorphous silicon film comprises the steps of:

subjecting the amorphous silicon film to a rapid thermal annealing process by applying lamp heat to the amorphous silicon film; and subjecting the amorphous silicon film to the laser annealing process by irradiating an excimer laser to the amorphous silicon film immediately after the rapid thermal annealing process.

3. The method of manufacturing a polycrystalline silicon film according to claim 2, wherein the step of subjecting the amorphous silicon film to the laser annealing process is performed before the step of subjecting the amorphous silicon film to the rapid thermal annealing process.

4. The method of manufacturing a polycrystalline silicon film according to claim 2, wherein the step of subjecting the amorphous silicon film to the laser annealing process is performed after the step of subjecting the amorphous silicon film to the rapid thermal annealing process.

5. The method of manufacturing a polycrystalline silicon film according to claim 2, wherein the step of subjecting the amorphous silicon film to the laser annealing process is performed immediately after the step of subjecting the amorphous silicon film to the rapid thermal annealing process.

6. The method of manufacturing a polycrystalline silicon film according to claim 1, wherein the step of polycrystallizing the amorphous silicon film by subjecting the amorphous silicon film to the lamp annealing process and the laser annealing process is carried out by means of an annealing apparatus in which rapid annealing processing portion for annealing an object to be annealed by irradiating halogen light and laser annealing processing portion for annealing the object to be annealed by irradiating an excimer laser are closely arranged, after the amorphous silicon film is formed over the material film having the high thermal conductivity.

7. The manufacturing method according to claim 1, wherein said lamp annealing process is a rapid thermal annealing process.

8. A polycrystalline silicon film manufactured by the manufacturing method according to claim 1.

9. A matrix-type liquid crystal display comprising a plurality of pixels, a switching element for driving each pixel, and a driving circuit comprising a plurality of switching elements, wherein the switching elements for driving the pixels and/or the switching elements in the driving circuit are formed from a polycrystalline silicon film manufactured according to the manufacturing method of claim 1.

10. A method of manufacturing a thin film transistor with a bottom gate structure formed on a glass substrate, comprising the steps of:

forming a gate electrode film with a predetermined pattern on the glass substrate;

forming an amorphous silicon film on a gate insulating film which lies over a gate electrode material film; and polycrystallizing the amorphous silicon film by subjecting the amorphous silicon film to a lamp annealing process using lamp irradiation applied at least from the above substrate and a subsequent laser annealing process using a laser beam applied from above the substrate after the lamp annealing process to form a polycrystalline silicon film.

11. The method of manufacturing a thin film transistor according to claim 10, wherein the step of polycrystallizing the amorphous silicon film comprises the steps of:

subjecting the amorphous silicon film to a rapid thermal annealing process by applying lamp heat to the amorphous silicon film; and subjecting the amorphous silicon film to the laser annealing process by irradiating an excimer laser to the amorphous silicon film immediately after the rapid thermal annealing process.

12. The method of manufacturing a thin film transistor according to claim 10, wherein the step of polycrystallizing the amorphous silicon film by subjecting the amorphous silicon film to the lamp annealing process and the laser annealing process is carried out by means of an annealing apparatus comprising rapid thermal annealing processing portion for annealing an object to be annealed by irradiating halogen light and laser annealing processing portion for annealing the object to be annealed by irradiating an excimer laser, in this order after the amorphous silicon film is formed over the gate electrode material film having high thermal conductivity.

13. The method of manufacturing a thin film transistor according to claim 10, wherein the thin film transistor obtained is used as a switching element for driving the respective pixel of a matrix type display apparatus and/or switching element for a driver circuit of the matrix type display apparatus.

14. A method of manufacturing a thin film transistor according to claim 10, further comprising the steps of:
  doping impurities to the polycrystalline silicon film, the polycrystalline silicon film being formed by polycrystallizing the amorphous silicon film; and
  activating the doped impurities by subjecting the polycrystalline silicon film to the laser annealing process and/or the lamp annealing process, whereby source and drain regions and a channel region of the thin film transistor are formed in the polycrystalline silicon film.

15. The method of manufacturing a thin film transistor according to claim 14, wherein the step of polycrystallizing the amorphous silicon film comprises the steps of:
  subjecting the amorphous silicon film to a rapid thermal annealing process by applying lamp heat to the amorphous silicon film; and
  subjecting the amorphous silicon film to the laser annealing process by irradiating an excimer laser to the amorphous silicon film immediately after the rapid thermal annealing process.

16. The method of manufacturing a thin film transistor according to claim 14, wherein the step of polycrystallizing the amorphous silicon film by subjecting the amorphous silicon film to the lamp annealing process and the laser annealing process is carried out by means of an annealing apparatus comprising rapid thermal annealing processing portion for annealing an object to be annealed by irradiating halogen light and laser annealing processing portion for annealing the object to be annealed by irradiating an excimer laser, in this order after the amorphous silicon film is formed over the gate electrode material film having high thermal conductivity.

17. The method of manufacturing a thin film transistor according to claim 14, wherein the thin film transistor obtained is used as a switching element for driving the respective pixel of a matrix type display apparatus and/or a switching element for a driver circuit of the matrix type display apparatus.

18. A thin film transistor manufactured by the manufacturing method according to claim 14.

19. A matrix-type liquid crystal display comprising a plurality of pixels, a switching element for driving each pixel, and a driving circuit comprising a plurality of switching elements, wherein the switching elements for driving the pixels and/or the switching elements in the driving circuit are thin film transistors manufactured according to the manufacturing method of claim 14.

20. The manufacturing method according to claim 10, wherein said lamp annealing process is a rapid thermal annealing process.

21. A thin film transistor manufactured by the manufacturing method according to claim 10.

22. A matrix-type liquid crystal display comprising a plurality of pixels, a switching element for driving each pixel, and a driving circuit comprising a plurality of switching elements, wherein the switching elements for driving the pixels and/or the switching elements in the driving circuit are thin film transistors manufactured according to the manufacturing method of claim 10.

* * * * *